(12) United States Patent
Swaminathan et al.

(10) Patent No.: US 10,187,996 B2
(45) Date of Patent: Jan. 22, 2019

(54) PRINTED CIRCUIT BOARD WITH A RECESS TO ACCOMMODATE DISCRETE COMPONENTS IN A PACKAGE

(71) Applicant: Intel Corporation, Santa Clara, CA (US)

(72) Inventors: Rajasekaran Swaminathan, Chandler, AZ (US); Ram S. Viswanath, Phoenix, AZ (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 15/459,787

(22) Filed: Mar. 15, 2017

(65) Prior Publication Data

US 2018/0270957 A1   Sep. 20, 2018

(51) Int. Cl.
| | |
|---|---|
| *H05K 1/18* | (2006.01) |
| *H05K 1/11* | (2006.01) |
| *H05K 3/00* | (2006.01) |
| *H05K 3/30* | (2006.01) |
| *H05K 3/46* | (2006.01) |

(52) U.S. Cl.
CPC ............ *H05K 1/183* (2013.01); *H05K 1/113* (2013.01); *H05K 3/0014* (2013.01); *H05K 3/303* (2013.01); *H05K 3/46* (2013.01); *H05K 2201/10628* (2013.01); *H05K 2201/10719* (2013.01); *H05K 2201/10734* (2013.01)

(58) Field of Classification Search
USPC ................................................ 361/783, 766
See application file for complete search history.

(56) References Cited

U.S. PATENT DOCUMENTS

| | | | |
|---|---|---|---|
| 2009/0047823 A1* | 2/2009 | Lin ...................... | H05K 7/1053 439/370 |
| 2012/0140929 A1* | 6/2012 | Clark ..................... | G06F 21/79 380/277 |

* cited by examiner

*Primary Examiner* — Andargie M Aychillhum
(74) *Attorney, Agent, or Firm* — Schwabe, Williamson & Wyatt, P.C.

(57) ABSTRACT

Embodiments of the present disclosure provide techniques for a printed circuit board (PCB) with a recess to accommodate discrete components of a package attachable to the PCB, in accordance with some embodiments. In one embodiment, a PCB may include a recess disposed in at least a portion of the PCB, to receive at least a portion of a package. The package may be attachable to the PCB via a plurality of connectors. The connectors may be disposed on a side of the package that faces the PCB. The portion of the package may include one or more discrete components disposed on the side of the package that faces the PCB. The recess may have a depth to accommodate those discrete components that have a height that is greater than a height of the connectors. Other embodiments may be described and/or claimed.

19 Claims, 7 Drawing Sheets

PRINTED CIRCUIT BOARD WITH A RECESS TO ACCOMMODATE DISCRETE COMPONENTS IN A PACKAGE

FIELD

Embodiments of the present disclosure generally relate to the field of printed circuit board fabrication and in particular to techniques for providing recesses in printed circuit boards, such as motherboards, to accommodate discrete components in a package.

BACKGROUND

Current printed circuit board (PCB) may be provided with a through hole (e.g., a hole in the motherboard (HiMB)), to enable sufficient clearance for accommodating discrete components, such as capacitors, inductors, or the like, that may be attached at the bottom of a semiconductor package to be mounted on the PCB. However, using such through holes requires removing potentially valuable PCB layers that could have been used for signal routing or other needs. Furthermore, PCB with through holes provided for accommodating discrete components of a package may require providing a special shield to the opposite side of the PCB, to reduce or eliminate electromagnetic interferences, to which the package may be susceptible. Such solutions may result in an increase of the overall size (e.g., z-height) of the PCB, which may negatively impact form factor requirements, particularly for PCB to be used in compact computing devices, such as smart phones or wearable devices.

BRIEF DESCRIPTION OF THE DRAWINGS

Embodiments will be readily understood by the following detailed description in conjunction with the accompanying drawings. To facilitate this description, like reference numerals designate like structural elements. Embodiments are illustrated by way of example and not by way of limitation in the figures of the accompanying drawings.

DETAILED DESCRIPTION

Figure 1:
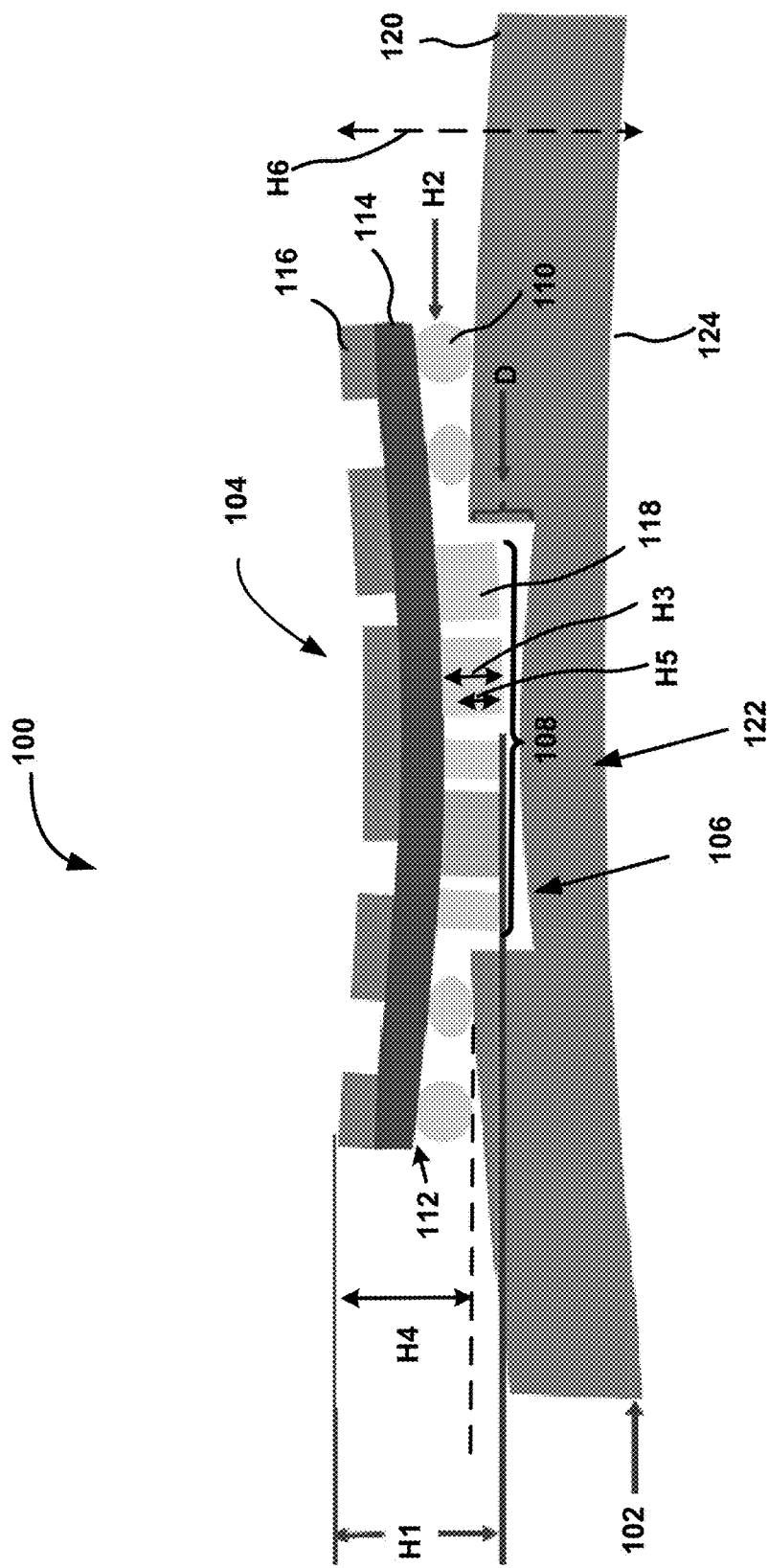
FIG. 1 is a diagram illustrating an example system including a PCB with a recess, and a semiconductor package attached to the PCB, in accordance with some embodiments.

Embodiments of the present disclosure include techniques and configurations for a PCB with a recess to accommodate discrete components of a package attachable to the PCB, in accordance with some embodiments. In one embodiment, a PCB may include a recess disposed in at least a portion of the PCB, to receive at least a portion of a package. The package may be attachable to the PCB via a plurality of connectors. The connectors may be disposed on a side of the package that faces the PCB. The portion of the package may include one or more discrete components disposed on the side of the package that faces the PCB. The recess may have a depth to accommodate those discrete components that have a height that is greater than a height of the connectors.

In embodiments, the PCB may further include one or more layers disposed at least in part underneath the recess. The layers may include one or more interconnects, at least some of which may be disposed underneath the recess, to provide for communications between the package and other components disposed on the PCB. At least one of the layers disposed at least in part underneath the recess may include a ground layer to ground the package via ground interconnects disposed a least in part underneath the recess.

In the following detailed description, reference is made to the accompanying drawings that form a part hereof, wherein like numerals designate like parts throughout, and in which are shown by way of illustration embodiments in which the subject matter of the present disclosure may be practiced. It is to be understood that other embodiments may be utilized and structural or logical changes may be made without departing from the scope of the present disclosure. Therefore, the following detailed description is not to be taken in a limiting sense, and the scope of embodiments is defined by the appended claims and their equivalents.

For the purposes of the present disclosure, the phrase "A and/or B" means (A), (B), (A) or (B), or (A and B). For the purposes of the present disclosure, the phrase "A, B, and/or C" means (A), (B), (C), (A and B), (A and C), (B and C), or (A, B, and C).

The description may use perspective-based descriptions such as top/bottom, in/out, over/under, and the like. Such descriptions are merely used to facilitate the discussion and are not intended to restrict the application of embodiments described herein to any particular orientation.

The description may use the phrases "in an embodiment" or "in embodiments," which may each refer to one or more of the same or different embodiments. Furthermore, the terms "comprising," "including," "having," and the like, as used with respect to embodiments of the present disclosure, are synonymous.

The term "coupled with," along with its derivatives, may be used herein. "Coupled" may mean one or more of the following. "Coupled" may mean that two or more elements are in direct physical, electrical, or optical contact. However, "coupled" may also mean that two or more elements indirectly contact each other, but yet still cooperate or interact with each other, and may mean that one or more other elements are coupled or connected between the elements that are said to be coupled with each other. The term "directly coupled" may mean that two or more elements are in direct contact.

FIG. 1 is a diagram illustrating an example system including a PCB with a recess, and a semiconductor package attached to the PCB, in accordance with some embodiments. The system 100 may include a PCB 102 configured to be coupled with a package 104, in accordance with embodiments described herein. In some embodiments, the PCB 102 may include a recess 106 provided in an upper portion of the PCB 102, as shown. In embodiments, the recess 106 may have a depth D, and may be configured to receive at least a portion 108 of the package 104. As shown, the package 104 may be attachable to the PCB 102 via a plurality of connectors 110 disposed on a side 112 of the package 104 that faces the PCB 102. In some embodiments, the connectors 110 may be disposed on a surface 120 of the PCB 102, to enable attachment of the package 104 to the PCB 102.

In embodiments, the package 104 may include a substrate 114 and a die 116 disposed on the substrate 114. Overall height (z-height) of the package 104 may be H1. As shown, the height H1 may take into account possible variances (e.g., deviation from strictly planar shape of the package 104). The connectors 110 may have a height (z-height) H2, as shown. The portion 108 of the package 102 may include one or more discrete components 118 disposed on the side 112 of the package 104. As shown, the discrete components 118 may have a height (z-height) H3. In some embodiments, the depth D of the recess 106 may be configured to accommodate those discrete components 118 that have a height H3 that is greater than a height H2 of the connectors 110. In other words, as a result of an attachment of the package 104 to the PCB 102, the discrete components 118 may be inserted in the recess 106, at least to a depth H5=H3-H2. Accordingly, z-height H3 of the discrete components 118 may not affect z-height H4 of a portion of the package 104 that may be disposed above the surface 120 of the PCB 102 as result of the attachment of the package 104 to the PCB 102. Thus, packages with the z-height H1 may only have a package portion with the z-height H4 <H1 disposed above the surface 120 of the PCB 102. Accordingly, the system 100 may comprise an ultra-thin package product, in which z-height H3 of the discrete components 118 may not affect overall z-height H6 of the system 100.

Furthermore, the area 122 underneath the recess 106 in the PCB 102 may be utilized for various purposes. For example, the PCB 102 layers disposed at least in part in the area 122 underneath the recess 106 may include one or more interconnects, and may be configured to provide for communications between the package 104 and other components disposed on the PCB 102. For example, the interconnects in the area 122 may be configured to provide for communications between the package 104 and another package that may be disposed on the side 124 of the PCB 102 (not shown in FIG. 1).

In another example, the PCB 102 layers disposed at least in part in the area 122 underneath the recess 106 may include a ground layer to ground the package 104 via ground interconnects disposed a least in part underneath the recess 106. Accordingly, the package 104 may be electrically isolated from interference that may occur due to presence of other components on the PCB in proximity to the package 104.

In some embodiments, the PCB 102 may comprise a motherboard, and the package 104 may comprise a central processing unit (CPU) package. Accordingly, the recess 106 may comprise a recess in the motherboard (RiMB).

Figure 2:
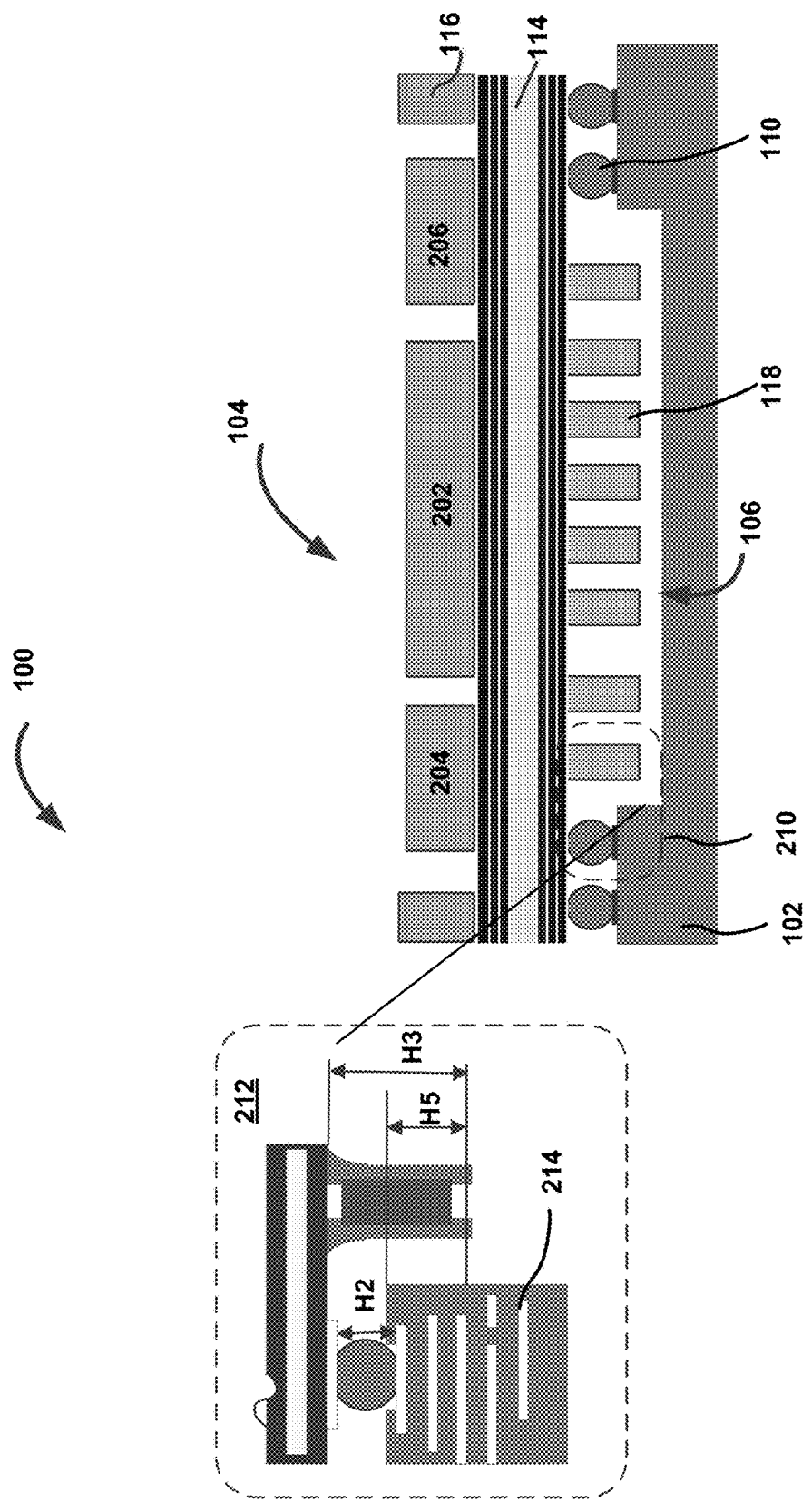
FIG. 2 is a diagram illustrating some aspects of the example system of FIG. 1, in accordance with some embodiments.

FIG. 2 is a diagram illustrating some aspects of the example system of FIG. 1, in accordance with some embodiments. For ease of understanding, like components of FIGS. 1 and 2 are indicated by like numerals.

As described above, in some embodiments, the PCB 102 may comprise a motherboard, and the package 104 may comprise a CPU package. As discussed above, the CPU package 104 may include the substrate 114 and the die 116. In some embodiments, the die 116 may include a CPU 202, an integrated voltage regulator (VR) 204 coupled with the CPU 202, and a platform controller hub (PCH) 206 coupled with the CPU 202. As shown, the connectors 110 used to attach the package 104 to the PCB 102 may comprise solder balls forming a ball grid array (BGA). In some embodiments, the connectors 110 may comprise a stud grid array (SGA), a land grid array (LGA), a mezzanine, or any other type of a tight-pitch, low z-height connector.

In some embodiments, the discrete components 118 may comprise at least one of: a capacitor, an inductor, a resistor, or other type of electric component.

View 212 illustrates a blow-out fragment 210 of the system 100, indicated by a dashed line. As shown, the PCB 102 may include multiple layers 214 configured to serve different purposes, such as providing signal layers for interconnect between the package 104 and other components of the PCB 102, providing ground layers, and so on.

As shown, z-height H5 indicating a difference between the height H3 of the discrete components 118 and the height H2 of the connectors 110 may define a best case minimum depth D for the recess 106 (typically assessed using statistical models, for example, by determining a best fit function for the recess depth, assuming that the package and board may be substantially flat), which may be need to accommodate the discrete components 118 inside the recess. In other words, the depth D of the recess 106 may be equal to or greater than z-height H5 indicated in FIG. 2. If the discrete components 118 have different z-heights, the depth D of the recess 106 may be equal to or greater than a difference between a height of a tallest discreet component of the discrete components 118 and the height H2 of the connectors 110. The described embodiments may provide for the following advantages, compared to conventional solutions. Providing a motherboard with the RiMB configured as described above may allow for the ability to electrically shield components of the CPU package using ground connections on the recess periphery (e.g., underneath the recess). Accordingly, in some embodiments, the areas proximate to the VR on the die and/or discrete components on the package maybe grounded, thus eliminating the need for an electromagnetic interference shield on the motherboard.

Also, a motherboard with the RiMB configured as described above may allow for the ability to surface mount the package using connectors (e.g., BGA) with package components (e.g., discrete components) that may be taller than the BGA standoff (z-height).

Further, a motherboard with the RiMB configured as described above may enable the use of motherboard routing resources (e.g., five-six layers) to route directly underneath the CPU package with discrete components attached on the package land (bottom) side, to enable single sided motherboard designs. Accordingly, at least some (in some cases, majority) of layers in the motherboard under the CPU may be used for signal routing.

Figure 3:
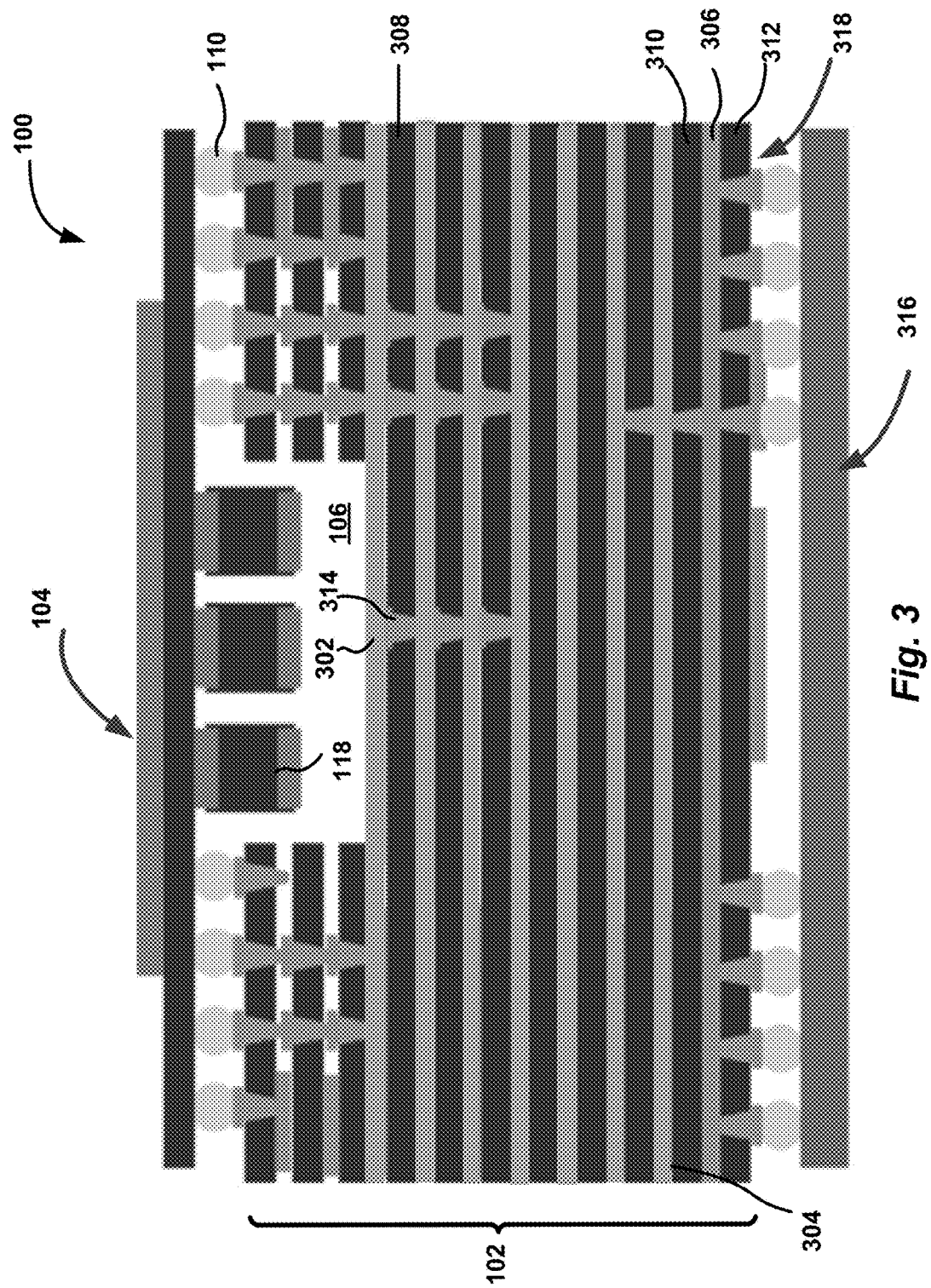
FIG. 3 illustrates an example implementation of the system of FIGS. 1-2, in accordance with some embodiments.

FIG. 3 illustrates an example implementation of the system of FIGS. 1-2, in accordance with some embodiments. For ease of understanding, like components of FIGS. 1-2 and 3 are indicated by like numerals. In embodiments, the package 104 attached to the PCB 102 via BGA 110 may comprise a system on chip (SOC). In embodiments, the PCB 102 may comprise a motherboard and include multiple layers (e.g., 302, 304, 306) disposed on respective substrate dielectric layers (e.g., 308, 310, 312 respectively), some of which may be signal or ground layers. For example, layers 302 and 306 may comprise signal layers, and layer 304 may comprise a ground layer or the other way around. It should be understood that the layers are indicated as ground or signal layers for purposes of illustration only; different configurations of multiple layers are possible to implement for the PCB 102.

As discussed above, the area of the PCB 102 below the recess 106 may be utilized for communication and grounding purposes. For example, the signal layer 302, in combination with interconnects (vias) 314 (and other signal layers and interconnects not shown for purposes of simplicity) may provide for communications between the package 104 and another components of PCB 102. For example, the package 102 may communicate via 302 and 314 with a package or component 316, which may be disposed on the bottom side 318 of the PCB 102, as shown. The ground layer 304 may serve as a ground plane disposed at least in part below the recess (RiMB) 106, to electrically shield the package 104 from interference that may be imposed, for example, by the package 316.

Figure 4:
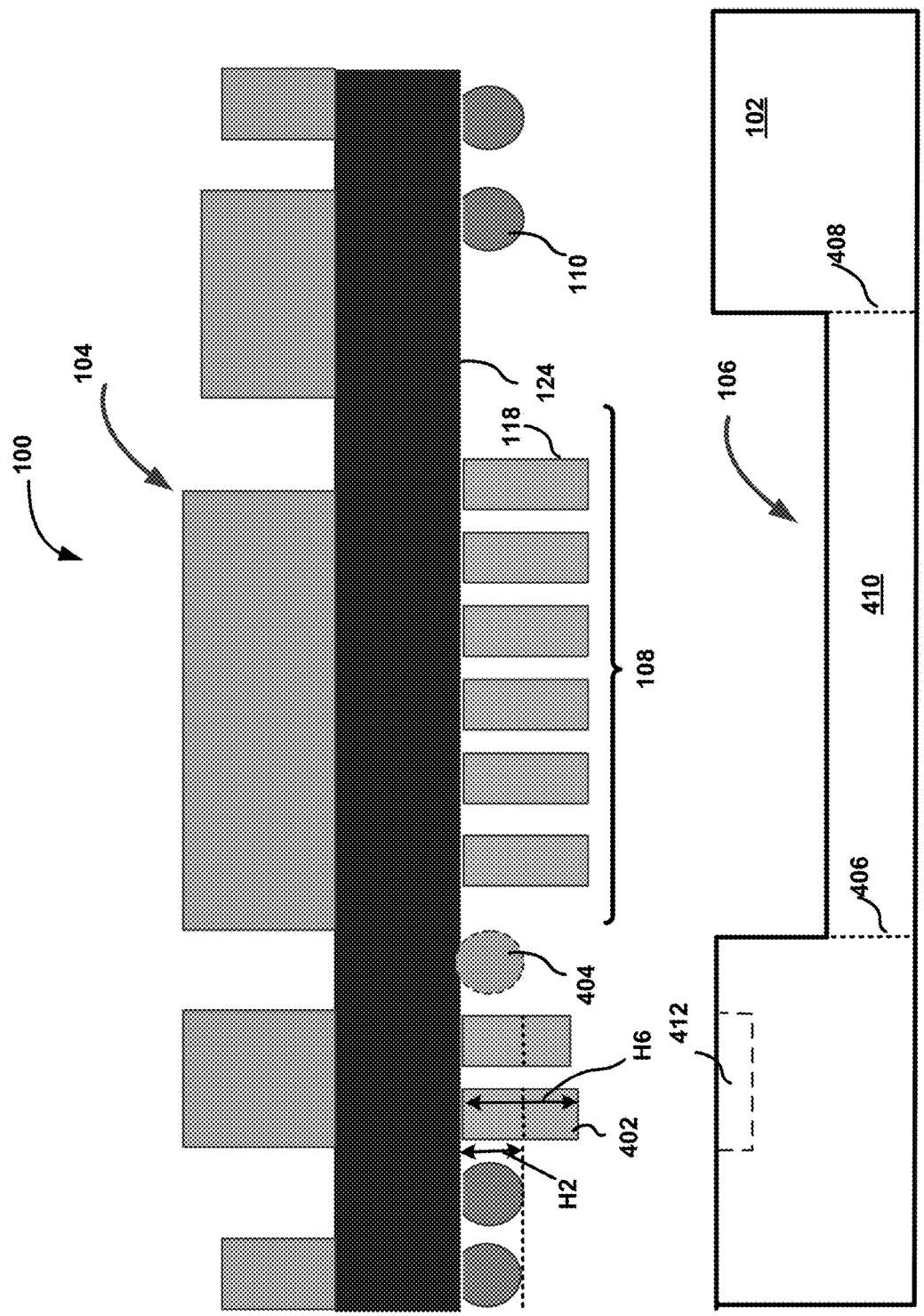
FIG. 4 is another diagram illustrating some aspects of the example system of FIG. 1, in accordance with some embodiments.

FIG. 4 is another diagram illustrating some aspects of the example system of FIG. 1, in accordance with some embodiments. For ease of understanding, like components of FIGS. 1 and 4 are indicated by like numerals.

As shown, the side 124 of the package 104 that faces the PCB 102 may include, in addition or in the alternative to the discrete components 118, one or more discrete components 402 disposed outside of the portion 108 of the package 104 to be received by the recess 106 (e.g., RiMB). As shown, the height of these components may be equal to or less than the height H2 of the connectors 110 (e.g., BGA). In some embodiments, when the height of the discrete components 402 may extend H2 (e.g., comprise z-height H6), additional cavities 412 (indicated by a dashed line) may be provided in the PCB 102, to accommodate the components 402. In some embodiments, the package 104 may be configured to enable a through hole solution for PCB 102, e.g., a hole in the motherboard (HiMB), depending on customer/PCB manufacturer preference.

For example, as shown in FIG. 4, the recess 106 may be extended to form a through hole 410 in the PCB 102, indicated by dotted lines 406 and 408. Extra connectors (e.g., solder balls) 404 may be provided on the side 124 of the package 104, to enable electromagnetic interference shielding for the HiMB solution, without need to provide an external shield, in the case of a HiMB solution, since there is no specific grounding layers in the hole in a HiMB solution.

Figure 5:
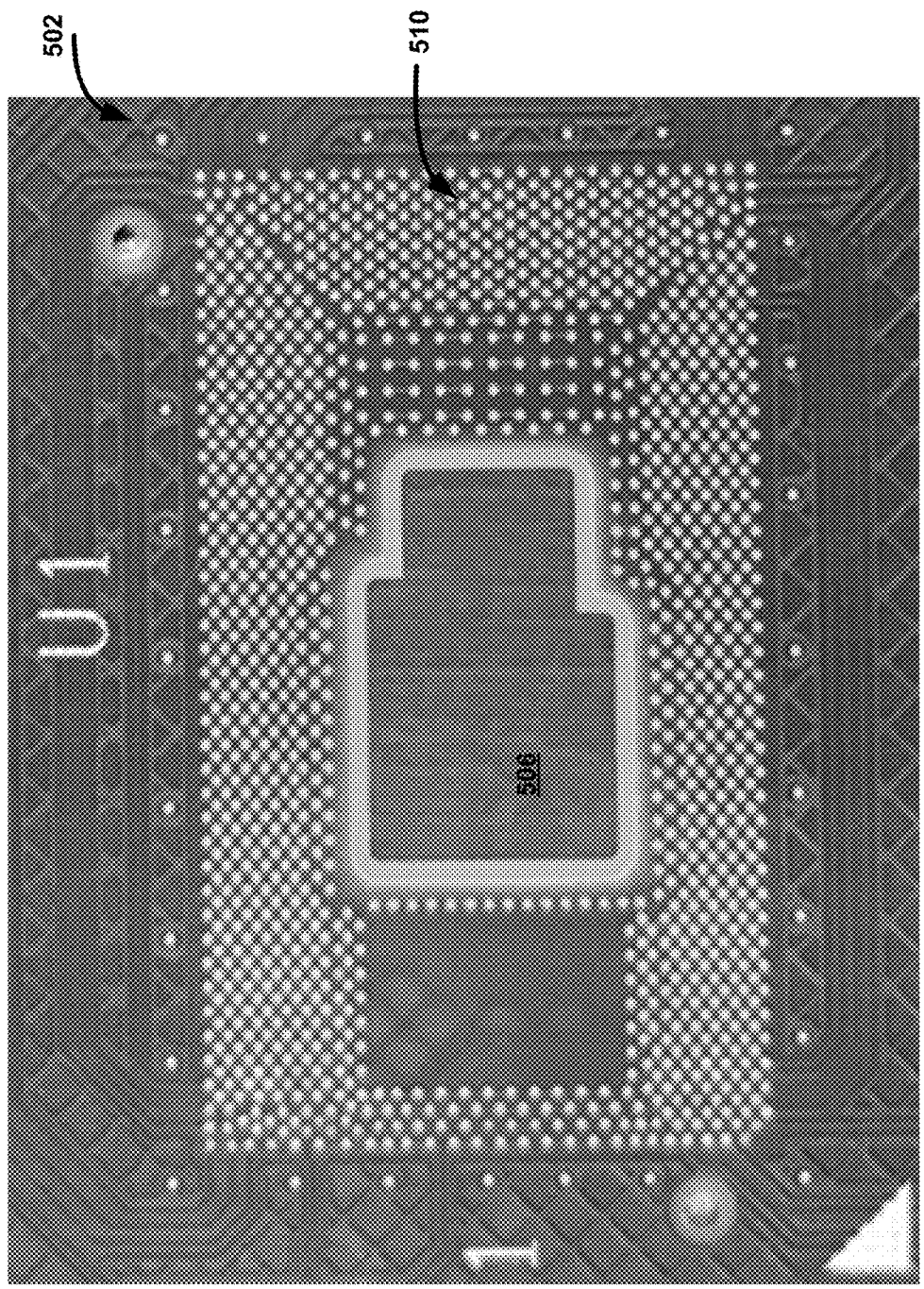
FIG. 5 illustrates a top view of an example motherboard with a recess, in accordance with some embodiments.

FIG. 5 illustrates a top view of an example motherboard with a recess, in accordance with some embodiments. As shown, the motherboard 502 may include a recess (RiMB) 506. The solder balls (BGA) 510 may be disposed around the recess 506, as shown, to provide for an attachment of a package (not shown) to the motherboard 502.

Figure 6:
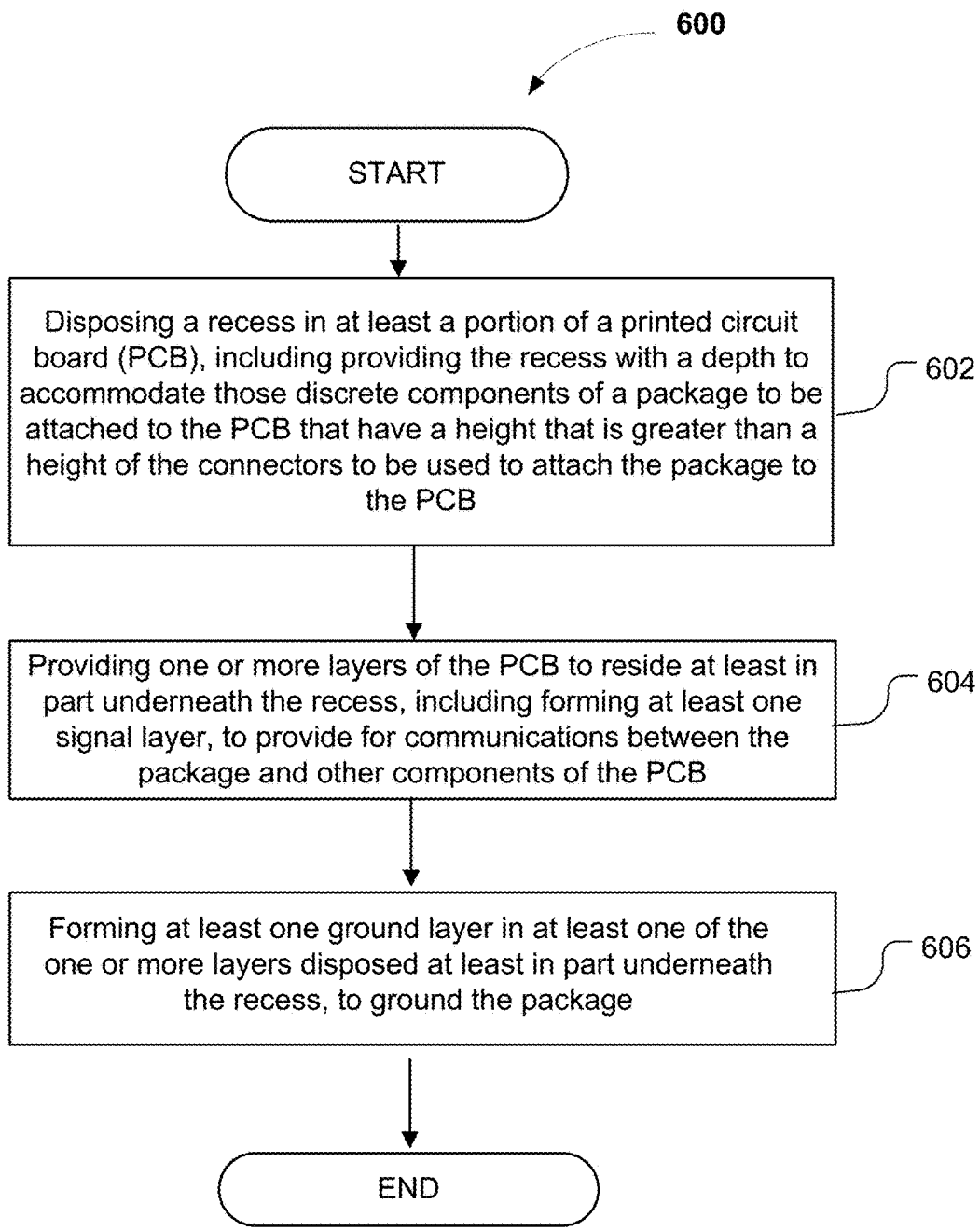
FIG. 6 is an example process flow diagram for providing a PCB with a recess, in accordance with some embodiments.

FIG. 6 is an example process flow diagram for providing a PCB with a recess, in accordance with some embodiments. The process 600 may comport with embodiments described in reference to FIGS. 1-4. The actions described in the process 600 may occur in different order or substantially simultaneously; the order provided below is for purposes of illustration and does not limit this disclosure.

The process 600 may begin at block 602 and include disposing a recess in at least a portion of a PCB, to accommodate at least a portion of a package. The package may be attachable to the PCB via a plurality of connectors. The portion of the package to be accommodated by the recess may include one or more discrete components disposed on a side of the package that faces the PCB. Disposing a recess in the PCB may include providing the recess with a depth to accommodate those discrete components that have a height that is greater than a height of the connectors. This may include forming the depth of the recess to be equal to or greater than a difference between a height of a tallest discreet component of the discrete components disposed on the portion of the package that is to be received by the recess, and the height of the connectors.

At block 604, the process 600 may include providing one or more layers of the PCB to reside at least in part underneath the recess, including forming at least one signal layer, to provide for communications between the package and other components of the PCB.

At block 606, the process 600 may include forming at least one ground layer in at least one of the layers disposed at least in part underneath the recess, to ground the package.

Figure 7:
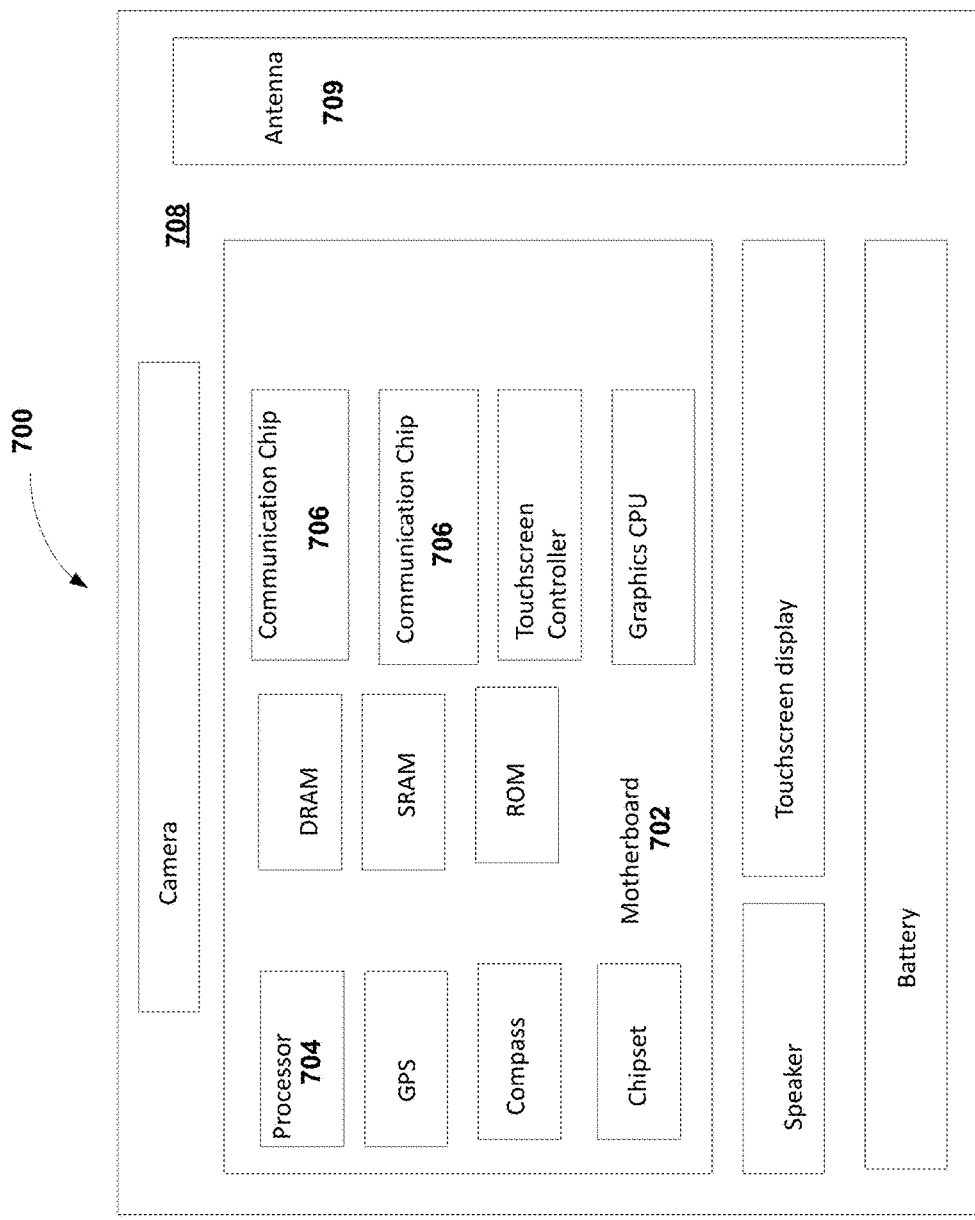
FIG. 7 illustrates an example computing device that may employ the apparatuses and/or methods described herein, in accordance with some embodiments.

FIG. 7 illustrates an example computing device 700 that may employ the apparatuses and/or methods described herein (e.g., the computing device 700 assembled on a motherboard 702 with IC packages), according to various embodiments.

Components of the computing device 700 may be housed in an enclosure (e.g., housing 708). The motherboard 702 may include a number of components, including but not limited to a processor 704 and at least one communication chip 706. In embodiments, the motherboard 702 may comprise the PCB 102, and processor 704 and other components (e.g., chip 706) may comprise the package 104 of FIG. 1. The processor 704 may be physically and electrically coupled to the motherboard 702. In some implementations, the at least one communication chip 706 may also be physically and electrically coupled to the motherboard 702. In further implementations, the communication chip 706 may be part of the processor 704. In addition, the computing device 700 may further include an antenna 709.

Depending on its applications, the computing device 700 may include other components that may or may not be physically and electrically coupled to the motherboard 702 and may or may not comprise the package 104. Some of these components are shown in FIG. 7 for purposes of explanation. These other components may include, but are not limited to, volatile memory (e.g., DRAM), static random access memory (SRAM), non-volatile memory (e.g., ROM), flash memory, a graphics central processing unit (CPU), a digital signal processor, a crypto processor, a chipset, a display, a touchscreen display, a touchscreen controller, a battery, an audio codec, a video codec, a power amplifier, a global positioning system (GPS) device, a compass, a Geiger counter, an accelerometer, a gyroscope, a speaker, a camera, and a mass storage device (such as hard disk drive, compact disk (CD), digital versatile disk (DVD), and so forth). These components may be included in IC packages, e.g., the IC package 104. The components, such as the processor 704, the communication chip 706, DRAM, SRAM, ROM, GPS, as well as discrete components similar to 118 of FIG. 1 may have different heights.

The communication chip 706 may enable wireless communications for the transfer of data to and from the computing device 700. The communication chip 706 may implement any of a number of wireless standards or protocols, including but not limited to Institute for Electrical and Electronic Engineers (IEEE) standards including Wi-Fi (IEEE 802.7 family), IEEE 802.16 standards (e.g., IEEE 802.16-2005 Amendment), Long-Term Evolution (LTE) project along with any amendments, updates, and/or revisions (e.g., advanced LTE project, ultra mobile broadband (UMB) project (also referred to as "3GPP2"), etc.). IEEE 802.16 compatible broadband wireless access (BWA) networks are generally referred to as WiMAX networks, an acronym that stands for Worldwide Interoperability for Microwave Access, which is a certification mark for products that pass conformity and interoperability tests for the IEEE 802.16 standards.

The communication chip 706 may operate in accordance with a Global System for Mobile Communication (GSM), General Packet Radio Service (GPRS), Universal Mobile Telecommunications System (UMTS), High Speed Packet Access (HSPA), Evolved HSPA (E-HSPA), or LTE network. The communication chip 706 may operate in accordance with Enhanced Data for GSM Evolution (EDGE), GSM EDGE Radio Access Network (GERAN), Universal Terrestrial Radio Access Network (UTRAN), or Evolved UTRAN (E-UTRAN). The communication chip 706 may operate in accordance with Code Division Multiple Access (CDMA), Time Division Multiple Access (TDMA), Digital Enhanced Cordless Telecommunications (DECT), Evolution-Data Optimized (EV-DO), derivatives thereof, as well as any other wireless protocols that are designated as 3G, 4G, 5G, and beyond. The communication chip 706 may operate in accordance with other wireless protocols in other embodiments.

The computing device 700 may include a plurality of communication chips 706. For instance, a first communication chip 706 may be dedicated to shorter range wireless communications such as Wi-Fi and Bluetooth and a second communication chip 706 may be dedicated to longer range wireless communications such as GPS, EDGE, GPRS, CDMA, WiMAX, LTE, EV-DO, and others.

In various implementations, the computing device 700 may be a mobile computing device, a laptop, a netbook, a notebook, an ultrabook, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, the computing device 700 may be any other electronic device that processes data.

The embodiments described herein may be further illustrated by the following examples.

Example 1 may be a PCB, comprising: a recess disposed in at least a portion of the PCB, to accommodate at least a portion of a package in response to an attachment of the package to the PCB, wherein the package is attachable to the PCB via a plurality of connectors, wherein the portion of the package includes one or more discrete components disposed on a side of the package that faces the PCB, wherein the recess has a depth to accommodate those discrete components that have a height that is greater than a height of the connectors.

Example 2 may include the PCB of example 1, wherein the plurality of connectors is disposed on the side of the package that faces the PCB.

Example 3 may include the PCB of example 1, wherein the depth of the recess is equal to or greater than a difference between a height of a tallest discreet component of the discrete components disposed on the portion of the package that is to be received by the recess, and the height of the connectors.

Example 4 may include the PCB of example 1, further comprising one or more layers disposed at least in part underneath the recess, wherein at least one of the one or more layers disposed at least in part underneath the recess comprises a signal layer, to provide for communications between the package and other components disposed on the PCB.

Example 5 may include the PCB of example 4, wherein at least one of the one or more layers disposed at least in part underneath the recess comprises a ground layer to ground the package.

Example 6 may include the PCB of example 1, wherein the one or more discrete components comprise one or more first discrete components, wherein the side of the package that faces the PCB further includes one or more second discrete components disposed outside of the portion of the package to be accommodated by the recess, wherein a height of the one or more second discrete components is equal to or less than the height of the connectors.

Example 7 may include the PCB of example 1, wherein the plurality of connectors comprises one of: a solder ball grid array (BGA), a stud grid array (SGA), a land grid array (LGA), or a mezzanine.

Example 8 may include the PCB of examples 1 to 7, wherein the PCB comprises a motherboard.

Example 9 may include the PCB of example 8, wherein the package comprises a central processing unit (CPU) package, wherein the CPU package includes a substrate, a CPU, an integrated voltage regulator (VR) coupled with the CPU, and a platform controller hub (PCH) coupled with the CPU, wherein the CPU, VR, and PCH are disposed on the substrate.

Example 10 may be a system, comprising: a PCB having a recess disposed in at least a portion of the PCB; and a package attachable to the PCB via a plurality of connectors, wherein a portion of the package includes one or more discrete components disposed on a side of the package that faces the PCB, wherein the recess is to accommodate the portion of the package that includes the one or more discrete components, in response to an attachment of the package to the PCB, wherein the recess has a depth to accommodate those discrete components that have a height that is greater than a height of the connectors.

Example 11 may include the system of example 10, wherein the plurality of connectors is disposed on the side of the package that faces the PCB.

Example 12 may include the system of example 10, the depth of the recess is equal to or greater than a difference between a height of a tallest discreet component of the discrete components disposed on the portion of the package that is to be received by the recess, and the height of the connectors.

Example 13 may include the system of example 10, wherein the PCB further includes one or more layers disposed at least in part underneath the recess, wherein at least one of the one or more layers disposed at least in part underneath the recess comprises a signal layer, to provide for communications between the package and other components disposed on the PCB.

Example 14 may include the system of example 13, wherein at least one of the one or more layers disposed at least in part underneath the recess includes a ground layer to ground the package.

Example 15 may include the system of example 10, wherein the one or more discrete components comprise one or more first discrete components, wherein the side of the package that faces the PCB further includes one or more second discrete components disposed outside of the portion of the package to be accommodated by the recess, wherein a height of the one or more second discrete components is equal to or less than the height of the connectors.

Example 16 may include the system of example 15, wherein the first and second discrete components include at least one of: a capacitor, an inductor, or a resistor.

Example 17 may include the system of example 10, wherein the PCB comprises a motherboard, wherein the package comprises a central processing unit (CPU) package, wherein the CPU package includes a substrate, a CPU, an integrated voltage regulator (VR) coupled with the CPU, and a platform controller hub (PCH) coupled with the CPU, wherein the CPU, VR, and PCH are disposed on the substrate.

Example 18 may include the system of any examples 10 to 17, wherein the plurality of connectors comprises a ball grid array (BGA), a stud grid array (SGA), a land grid array (LGA), or a mezzanine.

Example 19 may include the system of any examples 10 to 17, wherein the system comprises a computing device.

Example 20 may be a method, comprising: disposing a recess in at least a portion of a PCB, to accommodate at least a portion of a package, wherein the package is attachable to the PCB via a plurality of connectors, wherein the portion of the package includes one or more discrete components disposed on a side of the package that faces the PCB, wherein disposing a recess includes providing the recess with a depth to accommodate those discrete components that have a height that is greater than a height of the connectors; and providing one or more layers of the PCB to reside at least in part underneath the recess, including forming at least one signal layer, to provide for communications between the package and other components of the PCB.

Example 21 may include the method of example 20, wherein providing the recess with a depth to accommodate those discrete components that have a height that is greater than a height of the connectors includes forming the depth of the recess that is equal to or greater than a difference between a height of a tallest discreet component of the discrete components disposed on the portion of the package that is to be received by the recess, and the height of the connectors.

Example 22 may include the method of example 20, wherein providing one or more layers of the PCB to reside at least in part underneath the recess further includes forming at least one ground layer in at least one of the one or more layers disposed at least in part underneath the recess, to ground the package.

Example 23 may include the method of example 20, wherein the plurality of connectors comprises one of: a ball grid array (BGA), a stud grid array (SGA), a land grid array (LGA), or a mezzanine.

Example 24 may include the method of example 20, wherein the PCB comprises a motherboard, wherein the package comprises a central processing unit (CPU) package, wherein the CPU package includes a substrate, a CPU, an integrated voltage regulator (VR) coupled with the CPU, and a platform controller hub (PCH) coupled with the CPU, wherein the CPU, VR, and PCH are disposed on the substrate.

Example 25 may include the method of any examples 20 to 24, wherein the plurality of connectors is disposed on the side of the package that faces the PCB.

Various operations are described as multiple discrete operations in turn, in a manner that is most helpful in understanding the claimed subject matter. However, the order of description should not be construed as to imply that these operations are necessarily order dependent. Embodiments of the present disclosure may be implemented into a system using any suitable hardware and/or software to configure as desired.

Although certain embodiments have been illustrated and described herein for purposes of description, a wide variety of alternate and/or equivalent embodiments or implementations calculated to achieve the same purposes may be substituted for the embodiments shown and described without departing from the scope of the present disclosure. This application is intended to cover any adaptations or variations of the embodiments discussed herein. Therefore, it is manifestly intended that embodiments described herein be limited only by the claims and the equivalents thereof.

What is claimed is:

1. A printed circuit board (PCB), comprising:
    a recess disposed in at least a portion of the PCB, to accommodate at least a portion of a package in response to an attachment of the package to the PCB, wherein the package is attachable to the PCB via a plurality of connectors disposed on a side of the package that faces the PCB, in first and second portions of the side of the package, wherein the package includes a third portion of the side of the package that is separate from the first and second portions, wherein the third portion includes one or more discrete components, wherein at least one of the one or more discrete components have a first height that is greater than a second height of the connectors disposed in the first and second portions of the side of the package, wherein the third portion is free from the connectors,
    wherein the recess is to receive the third portion of the side of the package that includes the one or more discrete components, wherein a depth of the recess is equal to or greater than the first height of the at least one of the one or more discrete components, to accommodate the discrete components.

2. The PCB of claim 1, further comprising one or more layers disposed at least in part underneath the recess, wherein at least one of the one or more layers disposed at least in part underneath the recess comprises a signal layer, to provide for communications between the package and other components disposed on the PCB.

3. The PCB of claim 2, wherein at least one of the one or more layers disposed at least in part underneath the recess comprises a ground layer to ground the package.

4. The PCB of claim 1, wherein the one or more discrete components comprise one or more first discrete components, wherein the side of the package that faces the PCB further includes one or more second discrete components disposed outside of the third portion of the package to be accommodated by the recess, wherein a height of the one or more second discrete components is equal to or less than the second height of the connectors.

5. The PCB of claim 1, wherein the plurality of connectors comprises one of: a solder ball grid array (BGA), a stud grid array (SGA), a land grid array (LGA), or a mezzanine.

6. The PCB of claim 1, wherein the PCB comprises a motherboard.

7. The PCB of claim 6, wherein the package comprises a central processing unit (CPU) package, wherein the CPU package includes a substrate, a CPU, an integrated voltage regulator (VR) coupled with the CPU, and a platform controller hub (PCH) coupled with the CPU, wherein the CPU, VR, and PCH are disposed on the substrate.

8. A system, comprising:
    a printed circuit board (PCB) having a recess disposed in at least a portion of the PCB; and
    a package attachable to the PCB via a plurality of connectors disposed on a side of the package that faces the PCB, in first and second portions of the side of the package, wherein the package includes a third portion of the side of the package that is separate from the first and second portions, wherein the third portion includes one or more discrete components, wherein at least one of the one or more discrete components have a first height that is greater than a second height of the connectors disposed in the first and second portions of the side of the package, wherein the third portion is free from the connectors, wherein the recess is to receive the third portion of the side of the package that includes the one or more discrete components, in response to an attachment of the package to the PCB, wherein the recess has a depth that is equal to or greater than the first height of the at least one of the one or more discrete components, to accommodate the discrete components.

9. The system of claim 8, wherein the PCB further includes one or more layers disposed at least in part underneath the recess, wherein at least one of the one or more layers disposed at least in part underneath the recess comprises a signal layer, to provide for communications between the package and other components disposed on the PCB.

10. The system of claim 9, wherein at least one of the one or more layers disposed at least in part underneath the recess includes a ground layer to ground the package.

11. The system of claim 8, wherein the one or more discrete components comprise one or more first discrete components, wherein the side of the package that faces the PCB further includes one or more second discrete components disposed outside of the third portion of the package to be accommodated by the recess, wherein a height of the one or more second discrete components is equal to or less than the second height of the connectors.

12. The system of claim 11, wherein the first and second discrete components include at least one of: a capacitor, an inductor, or a resistor.

13. The system of claim 8, wherein the PCB comprises a motherboard, wherein the package comprises a central processing unit (CPU) package, wherein the CPU package includes a substrate, a CPU, an integrated voltage regulator (VR) coupled with the CPU, and a platform controller hub (PCH) coupled with the CPU, wherein the CPU, VR, and PCH are disposed on the substrate.

14. The system of claim 8, wherein the plurality of connectors comprises a ball grid array (BGA), a stud grid array (SGA), a land grid array (LGA), or a mezzanine.

15. The system of claim 8, wherein the system comprises a computing device.

16. A method, comprising:
disposing a recess in at least a portion of a printed circuit board (PCB), to accommodate at least a portion of a package, wherein the package is attachable to the PCB via a plurality of connectors, wherein the portion of the package includes one or more discrete components disposed on a side of the package that faces the PCB, in first and second portions of the side of the package, wherein the package includes a third portion of the side of the package that is separate from the first and second portions, wherein the third portion includes one or more discrete components, wherein at least one of the one or more discrete components have a first height that is greater than a second height of the connectors disposed in the first and second portions of the side of the package, wherein the third portion is free from the connectors, wherein disposing the recess includes providing the recess with a depth that is equal to or greater than the first height of the at least one of the one or more discrete components, to receive the third portion of the side of the package and accommodate the discrete components disposed in the third portion; and
providing one or more layers of the PCB to reside at least in part underneath the recess, including forming at least one signal layer, to provide for communications between the package and other components of the PCB.

17. The method of claim 16, wherein providing one or more layers of the PCB to reside at least in part underneath the recess further includes forming at least one ground layer in at least one of the one or more layers disposed at least in part underneath the recess, to ground the package.

18. The method of claim 16, wherein the plurality of connectors comprises one of: a ball grid array (BGA), a stud grid array (SGA), a land grid array (LGA), or a mezzanine.

19. The method of claim 16, wherein the PCB comprises a motherboard, wherein the package comprises a central processing unit (CPU) package, wherein the CPU package includes a substrate, a CPU, an integrated voltage regulator (VR) coupled with the CPU, and a platform controller hub (PCH) coupled with the CPU, wherein the CPU, VR, and PCH are disposed on the substrate.

* * * * *